United States Patent [19]
Gerhardt et al.

[11] 3,971,068
[45] July 20, 1976

[54] IMAGE PROCESSING SYSTEM

[75] Inventors: Lester A. Gerhardt, Elnora; Nelson R. Corby, Jr.; Edward M. Sims, both of Troy, all of N.Y.

[73] Assignee: The United States of America as represented by the Secretary of the Navy, Washington, D.C.

[22] Filed: Aug. 22, 1975

[21] Appl. No.: 607,081

[52] U.S. Cl. ............................. 358/82; 178/DIG. 6; 178/DIG. 8
[51] Int. Cl.² .......................................... H04N 9/02
[58] Field of Search ................. 178/DIG. 6, DIG. 8; 358/81, 82

[56] References Cited
UNITED STATES PATENTS

| | | | |
|---|---|---|---|
| 3,749,823 | 7/1973 | Warner | 358/81 |
| 3,806,633 | 4/1974 | Coleman | 358/81 |
| 3,849,793 | 11/1974 | Ablett | 358/81 |
| 3,909,840 | 9/1975 | Takahashi | 358/81 |

*Primary Examiner*—Robert L. Griffin
*Assistant Examiner*—Aristotelis M. Psitos
*Attorney, Agent, or Firm*—R. S. Sciascia; L. I. Shrago

[57] ABSTRACT

A portable, low-cost, bichannel image processing and enhancement system that can be programmed to accept two video sources, operate upon one or both simultaneously and deliver an enhanced result to a color monitor. The operations that can be performed on each source include, for example, unity gain, logarithmic amplification and differentiation, and both outputs thereafter can be subjected to such arithmetic operations as addition, subtraction and multiplication. The results are passed through an electronic user programmed window, color encoded by a quantizer and then displayed on a color monitor. The processor includes an area measurement circuit which quantitatively measures the percentage of the screen covered by any of the levels used in the quantizer, a luminance distribution analyzer which generates an histogram approximation to the distribution of grey levels in the image and a luminance cross-section analyzer which displays a graph of the image luminance along a vertical line.

8 Claims, 3 Drawing Figures

IMAGE PROCESSING SYSTEM

The present invention relates generally to image processing systems and, more particularly, to a real-time video processor which can be used to combine a pair of images in a display which highlights their common and distinquishing spatial and spectral features.

An effective technique which has been used to study both the composition and structure of objects is the observation of their reflectance and emission properties in the various ranges of the electromagnetic spectrum. This method, however, cannot be effectively employed to interpret large scale meteorological and maritime processes or geographical details because of the complexity of the instrumentation involved. Thus, for example, where the interpretation requires the study of isoluminance contour maps of a scene, the usual practice is to prepare a photograph or transparency in the field and, thereafter, scan this reproduction either by hand or under machine control with a densitometer. This is a laborious and time-consuming undertaking which requires the data to be plotted and then interpreted.

Electronic scanning systems have recently become available which scan and color encode the isoluminance contours in real time on a TV color monitor. However, these systems generally suffer from high-cost, size, weight and power consumption and are usually suitable for laboratory operation only.

It is, accordingly, a primary object of the present invention to provide a real-time image processing system which facilitates the analysis and interpretation of one or more time varying images.

Another object of the present invention is to provide an image processor which performs spatial processing and enhancement of two images in real time.

Another object of the present invention is to provide apparatus for permitting the real-time analysis of one or more time varying spatial images so as to permit their common and distinquishing features to be more readily identified.

Another object of the present invention is to provide an image processing system which operates in real time and is capable of providing luminance statistics for one or more images derived from different optical sensors.

Another object of the present invention is to provide a bichannel image processing system which can be programmed either manually, through a digital keyboard, or by a host computer for a variety of processing tasks.

Briefly, and in somewhat general terms, the present invention utilizes, for example, one or a pair of television cameras which may be equipped with both narrow-band and wide-band image tubes for providing up to two real-time video inputs. These inputs are connected by an operator to a pair of channels wherein each of these signals may be subjected to either unity gain, logarithmic ampliifcation or to two kinds of differentiation as well as nonlinear amplification of a general form. After this treatment, the two modified video signals are fed to an arithmetic unit which performs either an addition, subtraction, multiplication, division or logical intersection operation. The resulting signal is applied first to an N-level quantizer having staggered threshold levels and then to a color matrix which encodes these levels into individual signals representing three dissimilar colors. These signals are coupled to the red, green and blue amplifiers which drive the three different color guns of a tri-co lor picture tube monitor. By inserting pin-mounted resistances into a matrix board of the color matrix, the operator may select a color corresponding to each quantizer level. These colors also may be any combination of the three primary colors. As a result of the quantizing and color matrix operation, a color enhancement of the scenes is achieved.

It has been found that grey scale differences in an image are more readily comprehended by human operators if the grey scale is encoded into such contrasting colors. Thus, by contouring the brightness range of an image into, for example, four levels and then encoding these levels into dissimilar colors, the luminance structure of an image is more readily seen.

The apparatus also contains provisions for differentiating or edge-enhancing a scene and for measuring the percentage area of a scene spanned by a particular range of density. The system also is capable of displaying the luminance cross-section of the scene along any vertical line the operator chooses, as a graph superimposed on the color-enhanced display. Also, there is an enhancement window for selectively emphasizing any size rectangular area of the screen.

Other objects, advantages and novel features of the invention will become apparent from the following detailed description of the invention when considered in conjunction with the accompanying drawings wherein.

Figure 1:
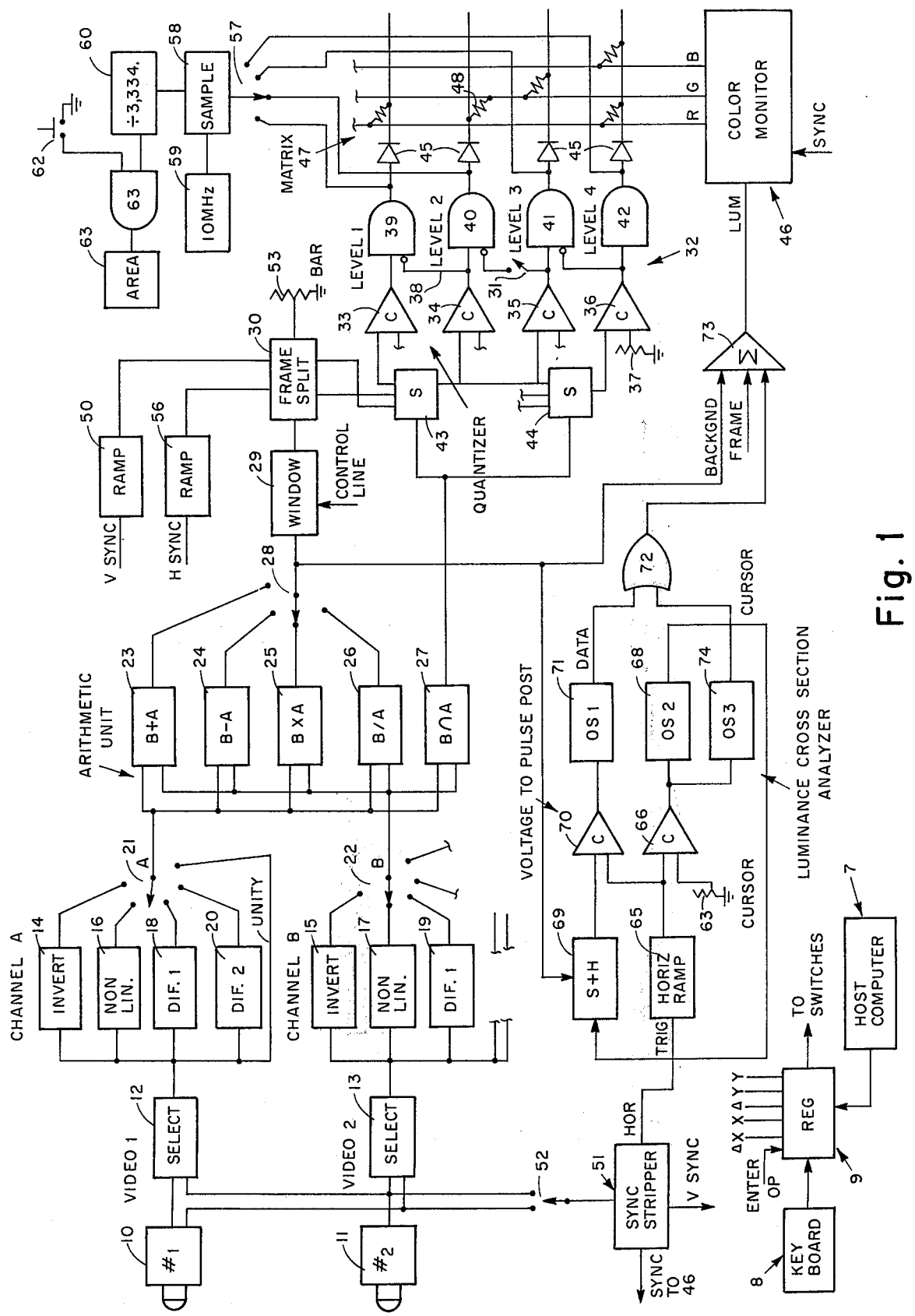
FIG. 1 is a schematic diagram illustrating the control circuit for the color monitor.

Referring now to FIG. 1 of the drawings, it will be seen that the overall system utilizes a pair of TV cameras 10 and 11 which in this illustrative embodiment are viewing the particular scenes which are to be directly compared and enhanced. Alternatively, one camera can serve as video source to both inputs so that complex transformation can be made on the video signal. These cameras, which here serve as the source of the video signals that are being processed, may be high-resolution 12 MHz close-circuit units with interchangeable image tubes. One of the tubes employed may be sensitive only to visible light and provide very high resolution in this portion of the spectrum. The other tube may be a vidicon with a silicon target sensitive to both visible and near infrared light in the 0.4 to 1.2 micron range. It would also be pointed out that the source of video signals may be a video tape or any other pre-recorded imagery. Also, these signals may be derived from a scan converter, a flying spot scanner or they may consist of time sequences of the same scene obtained from a suitable signal storage means associated with a single camera.

The available video signals may be initially amplified by preamplifying stages, not shown, and thereafter, these amplified signals are directed by selector switches 12 and 13 to separate signal channels A and B wherein each of these signals is subjected to unity gain, inversion in circuits 14 and 15, nonlinear amplification in circuits 17 and 18 and two types of differentiation in circuits 18, 19, 20 . . . which have different RC time constants. The operator can thus modify any of the original video signals, and after this initial pre-processing, the desired signals selected by switches 21 and 22 experience a plurality of arithmetic operations which include addition in circuit 23, subtraction in circuit 24, multiplication in circuit 25, division in circuit 26 and logical intersection in circuit 27. Selector switch 28 under the operator's control effectively determines which operation is performed. Switches 12, 13, 21, 22, 28 and all others in the system are implemented electronically. Their switching functions are determined by the contents of an operation register 9, which is programmed either manually through a keyboard 8, or remotely by optional host computer 7. If the operator elects to use one video source as input to both processing channels, more complex operations can be performed on the single signal. These would include A + differential A for crispening edges in an image; log. A — A, which is a nonlinear process causing "solarization" of the image; etc.

The signal resulting from the various analog operations is fed into a window circuit 29 and a frame splitter 30. Window circuit 29 does not modify or change the waveform of the video signals but merely serves to select those portions of the complete video sequence which are presented on the color monitor 46, one of the visual displays of the system. Frame splitter 30, when it is effective, subdivides the screen of the monitor into two parts. The upper part shows the regular processed video image, and the lower part is given over to a series of vertical colored bars corresponding to the level settings employed in the quantizer portion of the system and the colors chosen for the pseudo-color processing.

The height calibration bars established on the lower part of the color screen enables a permanent record to be made photographically of the settings of the various quantizing levels.

The video signal available at selector switch 28 is selectively applied to a four-level quantizer 32 which consists of four comparators 33, 34, 35 and 36 having staggered threshold levels of increasing values set by a corresponding number of potentiometers such as 37. Each of these comparators, as it is well known, produces an output only when its input signal exceeds the threshold level. Thus, depending upon the particular amplitude of the video signal and the mode of operation of the quantizer, one or a plurality of the comparators will be operational. Quantizer 32 has a feature whereby whenever a comparator corresponding to one signal level is effectively turned on, all comparators serving lower levels are turned off. This mode of operation is accomplished by the performance of a number of AND gates 39, 40, 41 and 42, one for each comparator. AND gate 39 obtains one of its inputs from the output of comparator 33 and the other of its inputs from the output of the next higher level comparator 34, after inversion. Likewise, AND gate 40 has as one of its inputs the output from comparator 34 while its second input is the inverted output from comparator 35, the next higher level comparator. Gate 41 has similar inputs, while the last AND gate 42 of the series, the one associated with the highest signal level merely has a single input from its comparator 36. In this regard, AND gate 42 does not truly perform as an AND gate but is shown as such a circuit for convenience sake.

The circuit interconnections, such as 38, which provide the second inputs to the various AND gates serve to gate each level output off unless all higher level outputs are low. Thus, for example, when the signal amplitude exceeds levels 1 and 2, comparators 33 and 34 will be operational, but only AND gate 40 will be gated on since connection 38 from comparator 34 will apply a blocking signal to AND gate 39. In this way, the number of lines from the gates which are high at any given time is restricted to only one.

In an alternative mode of operation, quantizer 32 has one of its lines, the one that provides the second input to AND gate 40, disconnected by a switch, such as 31, and the two resulting independent banks of comparators receive different signals — one from channel A and the other from channel B via switches 43 and 44.

When the quantizer 32 is operating in this intersection mode, it is customary to choose the colors associated with the independent sections such that their mixtures produce colors distinguishable from the unmixed colors. Consider the following binary case, for example. If the brighter parts of the channel A image are encoded red and the brighter parts of the channel B image encoded green, the user can observe the areas with high transmission through both channels as yellow, the mixture of red and green.

The output of quantizer 32 is applied via isolating diode 45 to a 4 × 3 color matrix 47. The three output lines of this matrix are connected to the three different amplifiers serving the color guns of a tri-color picture tube of monitor 46. Thus, depending upon the mode of operation of the quantizer, one or a combination of these guns are energized to reproduce the combined video images. Matrix 47 has a provision whereby the operator can select a color such as red, green or blue corresponding to a particular quantized level by inserting pin-mounted resistors such as 48 in a matrix board. By the same token, colors selected may be any combination of the three primary colors. This operation is called "color enhancement". Color monitor 46, thus, displays a color encoded isoluminance contour map of the original images. This is useful since the eye is not nearly as good at differentiating grey scale variations as it is at differentiating between colors. By quantizing and encoding the grey scale into different colors, the number corresponding to the number of levels in the quantization circuitry, subtle image properties are enhanced.

The luminance terminal of monitor 46 is utilized to superimpose a black and white image on the color encoded image. A positive signal at this input terminal increases the emission from the three color guns in the proper proportion to effectively lighten the image as a function of the signal amplitude at the corresponding scan position. Monitor 46 obtains its necessary synchronizing signals from sync stripper 51.

In the operation of frame splitter 30, a ramp waveform from circuit 50 is synchronized to the vertical sync pulse obtained from a sync stripper circuit 51 that has as its input one or the other video signals from the TV cameras 10 and 11 depending upon the setting of switch 52. This ramp is compared to a threshold calibration bar adjustment 53 and during that portion of the cycle, when the ramp voltage is less than the threshold, the normally processed video signal present at selector switch 28 is routed to the quantizer 32 via switches 43 and 44. When the ramp exceeds the threshold, a second ramp from circuit 56 synchronized to the horizontal sync pulse is fed to the quantizer. This second ramp is a calibration signal which generates the vertical calibration bars on the lower part of the screen.

The display presented on color monitor 46 may be analyzed to provide an indication of how much of its luminance falls between any two adjacent quantized levels, that is, what percentage of the area of the screen is covered by a given color. A selector switch 57 under the operator's control connects any of the input lines of the matrix to a sampler 58 whose sampling frequency is controlled by a 10 MHz source 59. The output of the sampler is applied to a divider 60 which divides the number of quantized samples by 3334, a factor which normalizes the counts to a percentage figure. The output of divider 60 is applied first to an AND gate 63 having an enabled switch 62 and then to a counter 63 whose reading provides the area measurement. A count of 100 corresponds to a 100 percent figure.

The system also has a luminance cross-section analyzer and this feature, as shown in FIG. 1, includes a horizontal ramp generator 65 which has a period equal to the horizontal sync signal and is synchronized to it. The ramp waveform thus produced serves as one input to a comparator 66 which has its other input established by the setting of a potentiometer 67 connected across a suitable source of DC voltage. Whenever the ramp exceeds this cursor setting, a one shot flip-flop 68 delivers a control pulse to a sample and hold circuit 69 which has as its input the video signal selected at selector switch 28. The sample so taken is held until a sample pulse is formed on the next line. When the sampled video and the horizontal ramp are equal, comparator 70 provides an input to a single shot flip-flop 71. The resulting pulse is applied through OR gate 72 and summation circuit 73 to the luminance control terminal of monitor 31 and generates a marker dot on the raster line. Thus, on each line following a sample pulse, a dot appears near the left-hand edge of the screen of monitor 46 whose position is proportional to the voltage sampled on the previous line. The output from comparator 66 also is applied to a third one shot flip-flop 74 whose output is applied to OR gate 72 and forms a cursor line on the screen of the monitor.

If the image is thought of as a three-dimensional surface with the horizontal scan along the X axis, vertical scan along the Y axis and luminance along the Z axis, the cursor can be thought of as a cross-section of the brightness surface. This is displayed as a straight vertical line denoting position in the XY plane together with a graph of the brightness along the line.

Figure 2:
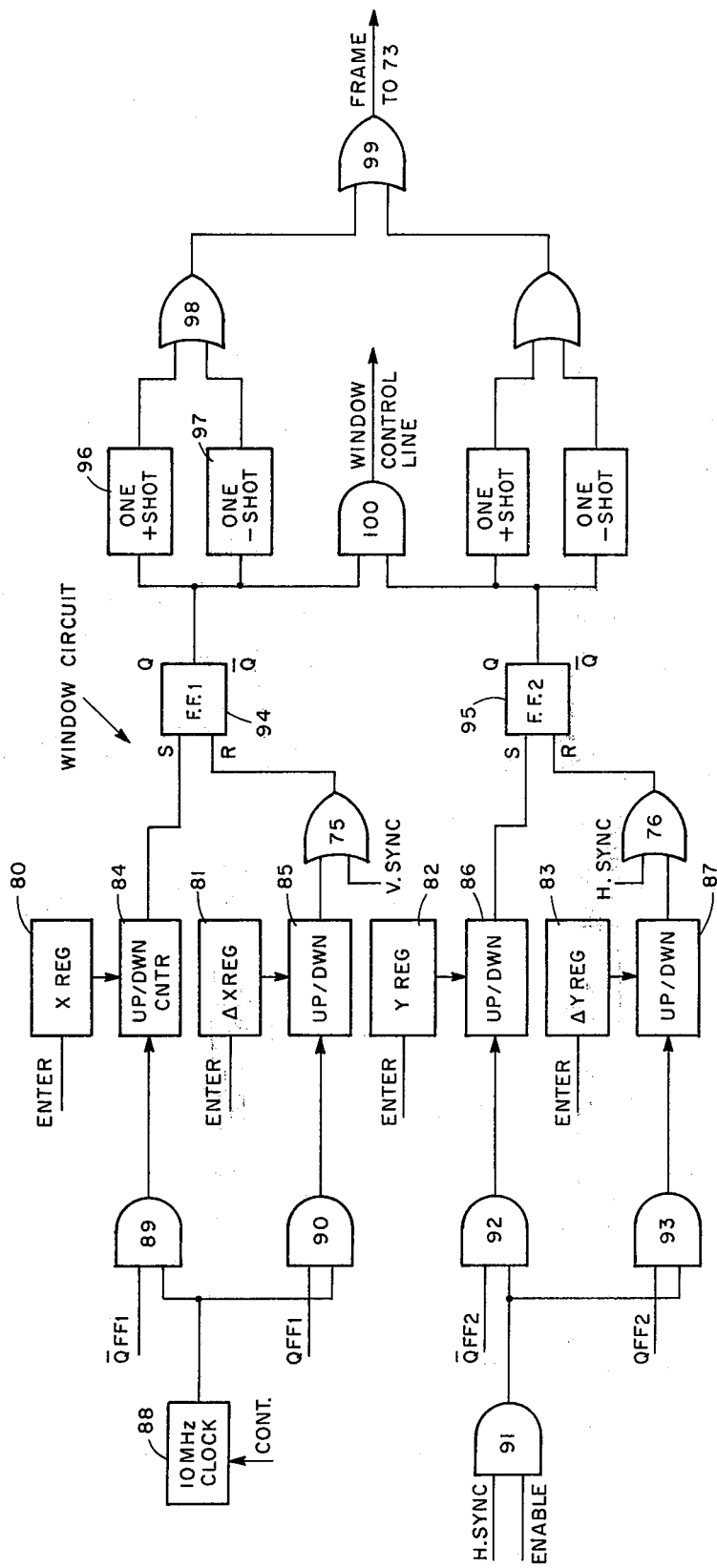
FIG. 2 shows the circuit that produces the window.

FIG. 2 shows the circuit for developing the electronic window which determines which rectangular portion of the image is to be color encoded or otherwise distinquished from the rest of the display. The operator, by selectively activating keyboard 8 shown in FIG. 1, establishes the dimensions and location of this window by registering preselected numbers in X register 80, $\Delta X$ register 81, Y register 82 and $\Delta Y$ register 83. These registers are used to reload their associated up and down counters 84, 85, 86 and 87. Up and down counters 84 and 85 are controlled from a 10 MHz clock 88 and a pair of AND gates 89 and 90. Up and down registers 86 and 87 are controlled by the horizontal sync signal which is applied to one input of a first AND gate 91 which has its other input controlled by an enable circuit. The output of AND gate 91 is applied to one input of a pair of AND gates 92 and 93. The second inputs to gates 89 and 90 are the normal, Q, and inverted signals, $\overline{Q}$, from a first flip-flop 94 while the other two inputs to gates 92 and 93 are similar signals from a second flip-flop 95. Flip-flops 94 and 95 are reset by OR gates 75 and 76 which have the vertical and horizontal sync pulses fed thereto as well as the outputs from counters 85 and 87, respectively. Thus, these flip-flops are reset if the counters fail to finish their counts.

At the beginning of each line, the 10 MHz clock pulses from source 88 are routed to the up and down counter 84 which is initially loaded with a count representing the X position of the window. When this counter reads 0, a borrow pulse sets flip-flop 94, and the 10 MHz pulses are now directed to the up and down counter 85 initially loaded with the $\Delta X$ quantity. When this counter reaches 0, a borrow pulse resets flip-flop 94 and disables the clock. Thus, flip-flop 94 generates a signal that is high for $\Delta X$ units and delayed by X units. The one shot flip-flops 96 and 97 coupled to circuit 94 generate a pulse on the leading and trailing edges of its output signal to mark the edges of the window aperture. These pulses pass through OR gates 98 and 99 to a summation circuit 73 in FIG. 1.

The Y and $\Delta Y$ circuits are identical to the X and $\Delta X$ units except that the 10 MHz clock 88 is replaced by the horizontal sync pulses.

The output of flip-flops 94 and 95 are fed to an AND gate 100 whose output forms the window control signal. This signal has a high amplitude to delineate the inside of the window and a low amplitude elsewhere. The high signal condition, as mentioned hereinbefore, determines which segments of the video signal selected by switch 28 is applied first to the quantizer, then to the matrix and, finally, to color monitor 46.

Figure 3:
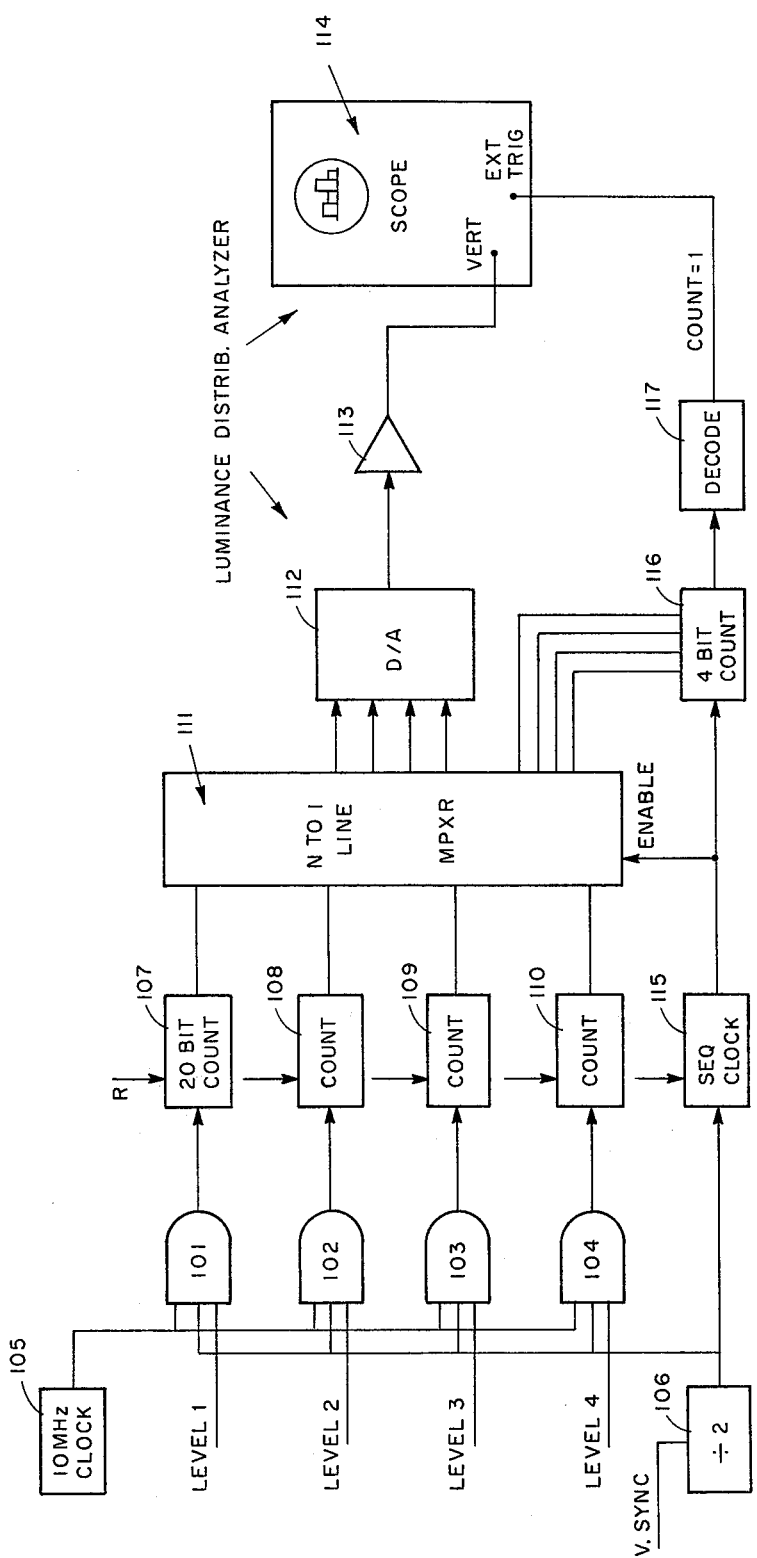
FIG. 3 is a box diagram of the luminance distribution analyzer.

The luminance distribution analyzer shown in FIG. 3 consists of a series of four AND gates 101, 102, 103 and 104 which have as their inputs a 10 MHz clock signal from source 105, alternative vertical sync signal obtained from a divide-by-two circuit 106 and the quantized video signals at the four different levels. The clock signals passed by each AND gate are summed in a 20-bit counter such as 107, 108, 109 and 110. Each digital count so recorded is sequentially connected via a multiplexer 111 addressed by four-bit counter 116, to a digital-to-analog converter 112. The analog voltages thus generated are amplified in circuit 113 and then applied to the vertical deflection electrode of an oscilloscope 114. The horizontal sweep triggering of this scope is controlled by a sequence clock 115, the four-bit counter 116 and a decoder 117 connected in a series relationship between circuit 105 and the trigger terminal of the scope.

In the operation of this circuit, the vertical sync pulses drive flip-flop 106, and the resultant signal provides a first time interval of 1/60 sec. wherein the signals at each level are measured and the counts accumulated in counters 107 through 110. In the next time interval, this counting terminates and the results are displayed on oscilloscope 114. In this regard, sequence clock 115 starts on the negative going edge of the waveform from divider 106 and it generates N + 2 pulses in 1/60 sec. where N is the number of levels to be displayed. The N + 2 pulses are counted up in four-bit counter 115 and decoded in circuit 117. When 117 decodes the count of 1, the scope is triggered. The sweep is set that the 1/60 time interval spans the width of the scope screen, with the scope operating in the external trigger mode. It would be pointed out that counter 116 is used to address the multiplexer and that the N + 1 pulse from the sequence clock resets the 20-bit counters, and the N + 2 pulse resets the clock.

Oscilloscope 114 generates an histogram approximation to the distribution of grey levels in the image. This display, it will be appreciated, is generated in real time.

The distribution analyzer allows complex high bandwidth video imagery to be reduced drastically by transforming the original image into its first order PDF. It has been shown that important properties of video imagery can be extracted from this first order PDF, and these characteristics can be transmitted or stored much more easily due to the reduced data rate.

It would be pointed out in connection with the available arithmetic functions that the operation which provides the ratio of the signals B/A has application to those situations where the signal B is either in a different spectral range from A or is the signal A delayed in time. Alternatively, B − A may be used for the purpose. The B − A condition gives a lower contrast image than B/A but will not saturate where, for example, A is at the black (or zero) level. The inverse A function often improves the visibility of subtle features in dark surroundings such as on an X-ray plate. The differentials may be employed to increase the sharp edge between black and white. The second differential, which is more responsive to very rapid changes in the image than the first differential, may be employed to extract vertical edges in an image. Additionally, the differentiation circuits can be used to enhance other high frequency information known as "fine texture".

It would also be pointed out that subtraction and division have the effect of comparing two images by taking their difference or quotient. Addition superimposes the images while multiplication correlates them. Logical intersection permits the simultaneous viewing of features of both inputs. The nonlinear or, for example, logarithmic amplification results in darker portions of the image being amplified more than the lighter portions. Such darker features are, therefore, more easily discernable. By varying the target voltage on the cameras, the relative amplification in the low-light and high-light areas may be changed.

It should be appreciated that all of the control functions such as the input signal selection, all of the processing operations such as signal inversion, differentiation nonlinear amplification and all of the arithmetic operations such as the addition, subtraction and multiplication, are determined by the content of register 9. This register also exercises control over the special functions such as the electronic window circuit and does so in conjunction with either the manual keyboard 8 or the remote host computer 7. The entire system can be programmed electronically by this host computer, and this characteristic allows for an easy expansion of the processor or a change in its architecture. This programming provision simplifies the operation of the system in that it frees the operator from the task of setting the various electronic switches in the overall system which determines the particular operating mode of the predecessor.

What is claimed is:

1. An image processing system comprising, in combination
    a first and second source of video signals which represent one or more images,
        each of said sources producing a signal sequence which duplicates the format generated by a television camera so that appropriate vertical and horizontal sync pulses are included therein;
    means for subjecting the video signals from both sources to a preliminary wave shaping operation which involves unity gain, logarithmic amplification or differentiation so as to produce first and second modified video signals;
    means for performing a preselected arithmetic operation with said first and second modified video signals which involves addition, subtraction, multiplication or division so as to produce processed video signals;
    means for comparing the amplitude of said processed video signals to a plurality of successively higher threshold levels and for developing quantized signals which correspond to the number of threshold levels that are exceeded by said processed video signals;
    means for combining selected ones of said quantized signals to form first, second and third encoded signals which designate those corresponding processed video signals that exceed predetermined combinations of said threshold levels;
    a monitor adapted to provide a color television type display on its screen,
        said monitor being synchronized by the horizontal and vertical sync pulses from said sources and having three electron guns adapted to produce a like number of different colors on said screen; and
    means for coupling said first, second and third encoded signals to different ones of said electron guns thereby to form on the screen of said monitor a color encoded image.

2. In an arrangement as defined in claim 1
    means for providing a quantitative indication of the percentage of the screen of said monitor on which appears a particular color produced by one of said encoded signals originating from a quantized signal developed by a processed video signal whose amplitude exceeds a particular threshold level.

3. In an arrangement as defined in claim 1 means for forming on the screen of said monitor a vertical graph which indicates the luminance level of the encoded image along a particular image line.

4. In an arrangement as defined in claim 1 wherein said means for combining selected ones of said quantized signals comprises a resistance matrix having an input line for each threshold and three output lines.

5. In an arrangement as defined in claim 1 wherein said monitor has a luminance control terminal which regulates the brightness of the image formed on the screen thereof; and
    means for coupling said processed video signals to said control terminal thereby to determine the background intensity of the image displayed on the screen of said monitor.

6. In an arrangement as defined in claim 1
    means for forming on the screen of said monitor a rectangular window so as to distinquish the image area within this window from the rest of the image displayed on the screen of said monitor.

7. In an arrangement as defined in claim 1 wherein said means for comparing the amplitude of said processed video signals to a plurality of successively high threshold levels only compares those processed video signals which correspond to a particular rectangular area of said one or more images.

8. In an arrangement as defined in claim 1
    an oscilloscope; and
    means for forming on the screen of the cathode ray tube of said oscilloscope a graphical representation depicting the quantized signals associated with the different threshold levels for a signal sequence corresponding to a particular image.

* * * * *